(12) United States Patent
Chi et al.

(10) Patent No.: US 12,300,624 B2
(45) Date of Patent: May 13, 2025

(54) ELECTRONIC DEVICE

(71) Applicant: Innolux Corporation, Miao-Li County (TW)

(72) Inventors: Jen-Hai Chi, Miao-Li County (TW); Yun-Sheng Chen, Miao-Li County (TW); Chia-Chi Ho, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 391 days.

(21) Appl. No.: 17/722,412

(22) Filed: Apr. 18, 2022

(65) Prior Publication Data

US 2022/0367370 A1 Nov. 17, 2022

Related U.S. Application Data

(60) Provisional application No. 63/186,808, filed on May 11, 2021.

(30) Foreign Application Priority Data

Jan. 13, 2022 (CN) .......................... 202210036440.7

(51) Int. Cl.
*H01L 23/538* (2006.01)
*H01L 23/367* (2006.01)
(Continued)

(52) U.S. Cl.
CPC ........ *H01L 23/5386* (2013.01); *H01L 23/367* (2013.01); *H01L 23/49833* (2013.01);
(Continued)

(58) Field of Classification Search
CPC .............. H01L 23/5386; H01L 23/367; H01L 23/49833; H01L 23/49844;
(Continued)

(56) References Cited

U.S. PATENT DOCUMENTS 9,343,448 B2 5/2016 Sakariya et al.
10,685,940 B2 6/2020 Steckel et al.
(Continued)

FOREIGN PATENT DOCUMENTS

JP 2008177618 7/2008
TW 201324759 6/2013
(Continued)

OTHER PUBLICATIONS

"Office Action of Taiwan Counterpart Application", issued on Aug. 17, 2023, p. 1-p. 4.
(Continued)

*Primary Examiner* — Fernando L Toledo
*Assistant Examiner* — Neil R Prasad
(74) *Attorney, Agent, or Firm* — JCIPRNET

(57) ABSTRACT

The disclosure provides an electronic device which includes a substrate structure, a driving component, and a conductive pattern. The driving component and the conductive pattern are formed on the substrate structure, and the thickness of the conductive pattern is greater than or equal to 0.5 μm and less than or equal to 15 μm.

19 Claims, 10 Drawing Sheets

(51) Int. Cl.
  *H01L 23/498* (2006.01)
  *H01L 25/16* (2023.01)
  *H01L 23/00* (2006.01)

(52) U.S. Cl.
  CPC .. *H01L 23/49844* (2013.01); *H01L 23/49866* (2013.01); *H01L 23/5385* (2013.01); *H01L 23/5389* (2013.01); *H01L 25/165* (2013.01); *H01L 25/167* (2013.01); *H01L 24/16* (2013.01); *H01L 24/17* (2013.01); *H01L 24/32* (2013.01); *H01L 24/73* (2013.01); *H01L 2224/16013* (2013.01); *H01L 2224/16057* (2013.01); *H01L 2224/16227* (2013.01); *H01L 2224/1703* (2013.01); *H01L 2224/17055* (2013.01); *H01L 2224/32225* (2013.01); *H01L 2224/73204* (2013.01); *H01L 2924/12041* (2013.01); *H01L 2924/13069* (2013.01); *H01L 2924/30101* (2013.01); *H01L 2924/30105* (2013.01); *H01L 2924/3025* (2013.01); *H01L 2924/3511* (2013.01)

(58) Field of Classification Search
  CPC ........... H01L 23/49866; H01L 23/5385; H01L 23/5389; H01L 25/165; H01L 25/167; H01L 24/16; H01L 24/17; H01L 24/32; H01L 24/73; H01L 2224/16013; H01L 2224/16057; H01L 2224/16227; H01L 2224/1703; H01L 2224/17055; H01L 2224/32225; H01L 2224/73204; H01L 2924/12041; H01L 2924/13069; H01L 2924/30101; H01L 2924/30105; H01L 2924/3025; H01L 2924/3511

See application file for complete search history.

(56) References Cited

U.S. PATENT DOCUMENTS

| | | | |
|---|---|---|---|
| 10,700,048 | B2 | 6/2020 | Zhang et al. |
| 2012/0128292 | A1 | 5/2012 | Hamamura et al. |
| 2016/0013170 | A1* | 1/2016 | Sakariya ................. H01L 33/38 257/13 |
| 2018/0190638 | A1 | 7/2018 | Chen et al. |
| 2020/0273800 | A1 | 8/2020 | Kim et al. |
| 2021/0028080 | A1 | 1/2021 | Pietambaram et al. |
| 2021/0336088 | A1* | 10/2021 | Park ........................ H01L 33/62 |

FOREIGN PATENT DOCUMENTS

| | | |
|---|---|---|
| TW | 201929215 | 7/2019 |
| TW | 202005089 | 1/2020 |
| TW | 202114269 | 4/2021 |

OTHER PUBLICATIONS

"Office Action of Taiwan Counterpart Application", issued on Dec. 30, 2022, p. 1-p. 6.

"Partial Search Report of Europe Counterpart Application", issued on Oct. 25, 2022, p. 1-p. 10.

"Search Report of Europe Counterpart Application", issued on Feb. 15, 2023, p. 1-p. 17.

* cited by examiner

ELECTRONIC DEVICE

CROSS-REFERENCE TO RELATED APPLICATION

This application claims the priority benefit of U.S. application Ser. No. 63/186,808, filed on May 11, 2021, and China application serial no. 202210036440.7, filed on Jan. 13, 2022. The entirety of each of the above-mentioned patent applications is hereby incorporated by reference herein and made a part of this specification.

BACKGROUND

1. Technical Field

The disclosure relates to an electronic device.

2. Description of Related Art

With the advancement of technology, the development of electronic devices is becoming more and more mature. However, electronic devices still have many problems to be improved, such as heat dissipation, resistive-capacitive (RC) loading, or warpage.

SUMMARY

The disclosure provides an electronic device that helps to improve at least one of problems such as heat dissipation, resistive-capacitive loading, or warpage.

According to an embodiment of the disclosure, an electronic device includes a substrate structure, a driving component, and a conductive pattern. The driving component and the conductive pattern are formed on the substrate structure, in which a thickness of the conductive pattern is greater than or equal to 0.5 μm and less than or equal to 15 μm.

In order to make the above-mentioned features and advantages of the disclosure more obvious and easy to understand, the following exemplified embodiments are described in detail in conjunction with the drawings.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1:
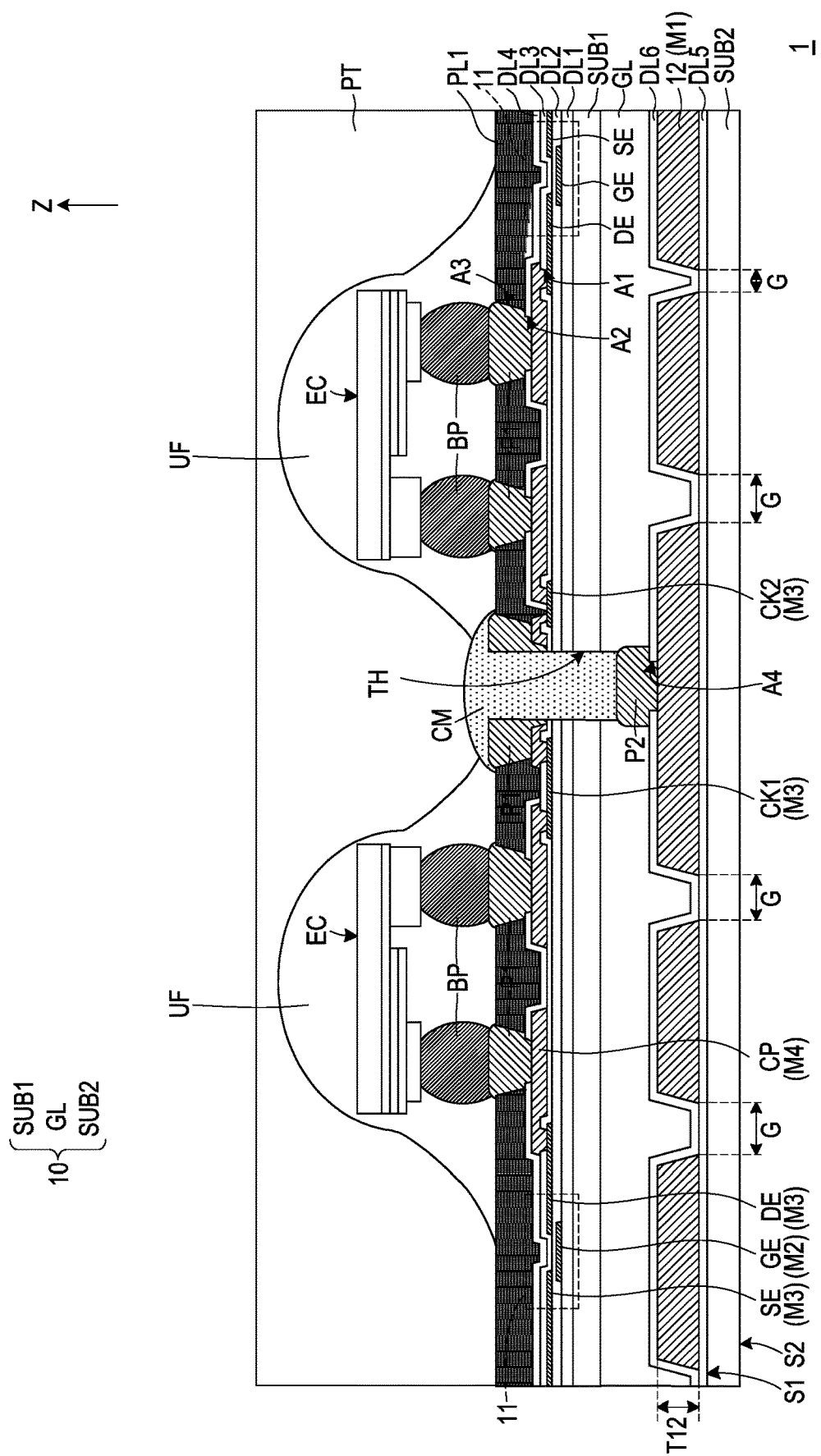
FIGS. 1 to 11 are partial cross-sectional schematic views of an electronic device according to some embodiments of the disclosure, respectively.

Reference will now be made in detail to the exemplary embodiments of the disclosure, examples of which are illustrated in the accompanying drawings. Whenever possible, the same reference numbers are used in the drawings and the description to refer to the same or like parts.

Certain terms are used throughout the specification and appended claims of the disclosure to refer to specific components. As those skilled in the art will understand, electronic device manufacturers may refer to the same components by different names. The disclosure does not intend to distinguish between components that have the same function but different names. In the following specification and claims, terms such as "including", "containing", and "having" are open-ended terms, and should therefore be interpreted as meaning "including but not limited to . . . ".

The directional terms mentioned in the disclosure, for example: "upper", "lower", "front", "rear", "left", "right" and like are only directions with reference to the accompanying drawings. Therefore, the directional terms used are for illustration, but not to limit the disclosure. In the drawings, each drawing shows the general features of the methods, structures and/or materials adopted in specific embodiments, but should not be construed as defining or limiting the scope or nature covered by the embodiments. For example, for clarity, the relative size, thickness, and position of each layer, region, and/or structure may be reduced or enlarged.

When a structure (or layer, component, substrate) is referred to as being located "on/above" another structure (or layer, component, substrate) in the disclosure, it may refer to the two structures being adjacent and directly connected, or it may mean that the two structures are adjacent but not directly connected. "Indirect connection" means that there is at least one intermediary structure (or intermediary layer, intermediary component, intermediary substrate, intermediary space) between the two structures, in which the lower surface of a structure is adjacent to or directly connected to the upper surface of the intermediary structure, and the upper surface of the other structure is adjacent to or directly connected to the lower surface of the intermediary structure. The intermediary structure may be a single-layer or multi-layer physical structure or non-physical structure, with no limit. In the disclosure, when a structure is disposed "on" another structure, it may mean that the structure is "directly" on another structure, or that the structure is "indirectly" on another structure, with at least one structure sandwiched between the two structures.

The terms "about", "equal to", "equivalent", "same", "substantially" or "approximately" are generally interpreted as being within 20% of a given value or range, or interpreted as being within 10%, 5%, 3%, 2%, 1%, or 0.5% of a given value or range.

Ordinal numbers such as "first", "second", and the like recited in the specification and claims are used to qualify components, and do not imply or represent that the component (or components) is/are preceded with any ordinal numbers, nor do they represent the order of one component with respect to another component, or the order of the manufacturing method. The ordinal numbers are used only to clearly distinguish a component with a certain name from another component with the same name. Different terms may be used in the claims and the specification, whereby a first component in the specification may be a second component in a claim.

The "electrical coupling" described in the disclosure includes electrical connection and coupling. The "electrical connection" or "coupling" described in the disclosure may refer to direct connection or indirect connection. In the case of direct connection, the endpoints of the components on the two circuits are directly connected or connected to each other by a conductor segment; in the case of indirect connection, the endpoints of the components on the two circuits may be provided therebetween with switch, diode, capacitor, inductor, resistor, other suitable components, or a combination thereof, but the disclosure is not limited thereto. The coupling described in the disclosure may mean that endpoints of the components on the two circuits are not connected to each other by any conductor.

In the disclosure, thickness, length, and width can be measured by an optical microscope, and the thickness or width can be measured by a cross-sectional image in an electron microscope, but the disclosure is not limited thereto. Moreover, any two values or directions used for comparison may have a certain amount of error. In addition, the terms "equal to," "equivalent," "same," "substantially," or "approximately" as used throughout the disclosure generally mean that they fall within 10% of a given value or range. Furthermore, wordings such as "a given range is from a first value to a second value", and "a given range is within a range from the first value to the second value" indicate that the given range includes the first value, the second value, and other values in between. If the first direction is described as being perpendicular to the second direction, the angle between the first direction and the second direction may be between 80 degrees and 100 degrees; if the first direction is described as being parallel to the second direction, the angle between the first direction and the second direction may be between 0 degrees and 10 degrees.

It is important to note that the following embodiments may, without departing from the spirit of the disclosure, replace, reorganize, and mix features of several different embodiments to complete other embodiments. The features between various embodiments can be mixed and matched arbitrarily as long as they do not violate the spirit of the invention or conflict with each other.

Unless otherwise defined, all terms (including technical and scientific terms) used herein have the same meaning as commonly understood by persons having ordinary skill in the art to which the disclosure belongs. It is understood that these terms, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

The electronic device disclosed in the specification may include a display device, a backlight device, an antenna device, a sensing device or a tiled device, but is not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing device may be a sensing device for sensing capacitance, light, heat or ultrasonic waves, but is not limited thereto. In the disclosure, the electronic components may include passive components and active components, such as capacitors, resistors, inductors, diodes, transistors, and the like. The diodes may include light emitting diodes or photodiodes. The light emitting diodes may include, for example, organic light emitting diodes (OLED), sub-millimeter light emitting diodes (mini LED), micro light emitting diodes (micro LED), or quantum dot light emitting diodes (quantum dot LED), but is not limited thereto. The tiled device may be, for example, a display tiled device or an antenna tiled device, but is not limited thereto. It should be noted that the electronic device may be any arrangement and combination of the foregoing, but not limited to thereto.

FIGS. 1 to 11 are partial cross-sectional schematic views of electronic devices according to some embodiments of the disclosure, respectively. It should be noted that the technical solutions provided by the different embodiments hereinafter can be replaced, combined or mixed, so as to constitute another embodiment without violating the spirit of the disclosure.

Referring to FIG. 1, an electronic device 1 may include a substrate structure 10, a driving component 11, and a conductive pattern 12. The driving component 11 and the conductive pattern 12 are formed on the substrate structure 10, wherein a thickness T12 of the conductive pattern 12 is greater than or equal to 0.5 μm and less than or equal to 15 μm. The thickness T12 of the conductive pattern 12 refers to the maximum thickness of the conductive pattern 12 in the thickness direction (e.g. a direction Z) of the electronic device 1 in the cross section (the sectional view shown in FIG. 1).

In detail, the substrate structure 10 may include one or more substrates. Taking FIG. 1 as an example, the substrate structure 10 may include a first substrate SUB1 and a second substrate SUB2, and the first substrate SUB1 and the second substrate SUB2 are combined by, for example, an adhesive layer GL, but not limited thereto.

Each of the first substrate SUB1 and the second substrate SUB2 may each include a polymer film, a porous film, glass, a printed circuit board, or a base layer including ceramic, stainless steel, or metal, but not limited thereto. The adhesive layer GL may include an optically clear adhesive (OCA) or an optically clear resin (OCR), but is not limited thereto.

The driving component 11 is formed on the substrate structure 10. For example, the driving component 11 may be directly formed on one substrate of the substrate structure 10 through a photolithography process. Taking FIG. 1 as an example, the driving component 11 is disposed on the first substrate SUB1, for example.

FIG. 1 schematically shows two driving components 11, and each of the driving components 11 is, for example, a transistor and includes a gate GE, a source SE, and a drain DE, but not limited thereto. It should be understood that the electronic device 1 may include more driving components 11, and the types of the driving components 11 may be changed according to requirements. For example, the driving component 11 may be an amorphous silicon thin-film transistor, a low-temperature polysilicon thin-film transistor, or an oxide thin-film transistor (e.g. indium gallium zinc oxide thin-film transistor). The various types of thin-film transistors may be either top-gate or bottom-gate forms of thin-film transistors. An etch barrier layer may or may not be formed on the channel layer of the bottom-gate oxide thin-film transistor.

Each of the driving components 11 may control one or more electronic components (including active components or passive components) in the electronic device 1. The driving components 11 may be directly formed on the first substrate SUB1 of the substrate structure 10. Alternatively, these driving components 11 may be bonded to the first substrate SUB1 by wire bonding, flip chip, tape-automated bonding (TAB), surface mount technology (SMT), chip on board (COB) or the like. When the driving component 11 is a chip, it may be an integrated circuit, a transistor (e.g. thin-film transistor) circuit, a silicon controlled rectifier or a combination of the above, but not limited thereto. The driving component 11 may be formed on a substrate (not shown) and then bonded to the first substrate SUB1. The material of the substrate may include polymer, glass, silicon, gallium arsenide, gallium nitride, gallium carbide, or sapphire, but is not limited thereto.

The conductive pattern 12 is formed on the substrate structure 10. For example, the conductive pattern 12 may be directly formed on one substrate of the substrate structure 10 through photolithography, electroplating, or electroless plating. Taking FIG. 1 as an example, the conductive pattern 12 is, for example, disposed on the second substrate SUB2. Further, the second substrate SUB2 includes a first side S1 facing the first substrate SUB1 and a second side S2 opposite to the first side S1, and the conductive pattern 12 is disposed on the first side S1, for example, but not limited thereto. In other embodiments, the conductive pattern 12 may be disposed on the second side S2.

FIG. 1 schematically shows five conductive patterns 12, all of which belong to a conductive layer M1, but it should be understood that the conductive layer M1 may include more or less conductive patterns 12. Furthermore, the material of the conductive pattern 12 may be selected according to the purpose of the conductive pattern 12. For example, when the conductive pattern 12 is configured to transmit signals, the material of the conductive pattern 12 may be selected from a material with high conductivity; when the conductive pattern 12 is configured to shield electromagnetic waves, the material of the conductive pattern 12 may be selected from a material with high absorptivity or reflectivity. In some embodiments, the material of the conductive pattern 12 (or the conductive layer M1) may include copper, aluminum, other highly conductive materials, or a combination thereof, but is not limited thereto.

According to different requirements, the electronic device 1 may also include other components or film layers. Taking FIG. 1 as an example, in addition to the substrate structure 10, the driving component 11 and the conductive pattern 12 (the conductive layer M1), the electronic device 1 may further include a dielectric layer DL1, a dielectric layer DL2, a dielectric layer DL3, a dielectric layer DL4, a dielectric layer DL5, a dielectric layer DL6, a passivation layer PL1, a conductive layer M2, a conductive layer M3, a conductive layer M4, a semiconductor layer (not shown), a plurality of pads P1, a plurality of pads P2 (only one is shown), a plurality of conductive bumps BP, a plurality of electronic components EC, a conductive material CM, an underfill UF, and a protective layer PT, but not limited thereto.

The dielectric layer DL1 is disposed on the first substrate SUB1. The dielectric layer DL1 may be configured to protect the first substrate SUB1, enhance the water blocking capability of the first substrate SUB1, or enhance the bonding force between the first substrate SUB1 and the conductive layer (e.g. the conductive layer M2). For example, the material of the dielectric layer DL1 may include silicon nitride, silicon oxide, non-conductive inorganic material, non-conductive polymer film, glue, or the like, but not limited thereto.

The conductive layer M2 is disposed on the dielectric layer DL1. The conductive layer M2 is, for example, a patterned conductive layer and may include a plurality of gates GE and other circuits (not shown). The material of the conductive layer M2 may include copper, aluminum, other highly conductive materials or a combination of the above, but not limited thereto.

The dielectric layer DL2 is disposed on the dielectric layer DL1 and covers the conductive layer M2. For example, the material of the dielectric layer DL2 may include silicon nitride, silicon oxide, non-conductive inorganic material, non-conductive polymer film, glue, or the like, but not limited thereto.

A semiconductor layer (not shown) is disposed on the dielectric layer DL2. The semiconductor layer is, for example, a patterned semiconductor layer and may include a plurality of channel patterns disposed above the plurality of gates GE. For example, the channel pattern may at least partially overlap with the corresponding gate GE in the direction Z, but is not limited thereto. The material of the semiconductor layer may include amorphous silicon, low temperature polysilicon or oxide thin-films, but not limited thereto.

The conductive layer M3 is disposed on the semiconductor layer. The conductive layer M3 is, for example, a patterned conductive layer and may include a plurality of conductive patterns (e.g. a plurality of sources SE, a plurality of drains DE, a circuit CK1, and a circuit CK2, but not limited thereto). The material of the conductive layer M3 may include copper, aluminum, other highly conductive materials or a combination of the above, but is not limited thereto.

The dielectric layer DL3 is disposed on the dielectric layer DL2 and covers the conductive layer M3. For example, the material of the dielectric layer DL3 may include silicon nitride, silicon oxide, non-conductive inorganic material, non-conductive polymer film, glue, or the like, but not limited thereto. The dielectric layer DL3 may include a plurality of openings A1 exposing the plurality of conductive patterns (e.g. the plurality of drains DE, the circuit CK1, and the circuit CK2) of the conductive layer M3, respectively.

The conductive layer M4 is disposed on the dielectric layer DL3. The conductive layer M4 is, for example, a patterned conductive layer and may include a plurality of conductive patterns CP. Each of the conductive patterns CP may be electrically connected to the corresponding drain DE, the circuit CK1 or the circuit CK2 through the corresponding opening A1. The material of the conductive layer M4 may include copper, aluminum, other highly conductive materials or a combination of the above, but is not limited thereto.

The dielectric layer DL4 is disposed on the dielectric layer DL3 and covers the conductive layer M4. For example, the material of the dielectric layer DL4 may include silicon nitride, silicon oxide, non-conductive inorganic material, non-conductive polymer film, glue, or the like, but not limited thereto. The dielectric layer DL4 may include a plurality of openings A2 exposing the plurality of conductive patterns CP of the conductive layer M4, respectively.

The passivation layer PL1 is disposed on the dielectric layer DL4. For example, the material of the passivation layer PL1 may include an organic polymer material, such as black photoresist, gray photoresist, white photoresist, or black matrix, but not limited thereto. The passivation layer PL1 may include a plurality of openings A3 exposing the plurality of conductive patterns CP, respectively. The opening A3 is disposed corresponding to the opening A2; that is, the opening A3 and the opening A2 at least partially overlap in the direction Z.

The plurality of pads P1 are respectively disposed corresponding to the plurality of openings A3. The pad P1 may be configured to reduce the probability of forming an intermetallic compound between the conductive bump BP and the conductive pattern CP. For example, the pad P1 may include electroless nickel immersion gold (ENIG), electroless nickel electroless palladium immersion gold (ENEPIG), immersion silver, electrolytic gold, or electrolytic nickel, but not limited thereto.

The dielectric layer DL5 is disposed on the second substrate SUB2, and the dielectric layer DL5 and the plurality of conductive patterns 12 are located on the same side (e.g. the first side S1) of the second substrate SUB2. The dielectric layer DL5 may be configured to protect the second substrate SUB2, enhance the water blocking capability of the second substrate SUB2, or enhance the bonding force between the second substrate SUB2 and the conductive layer (e.g. the conductive layer MD. For example, the material of the dielectric layer DL5 may include silicon nitride, silicon oxide, non-conductive inorganic material, non-conductive polymer film, glue, or the like, but not limited thereto.

The conductive layer M1 is disposed on the dielectric layer DL5. The conductive layer M1 is, for example, a patterned conductive layer and may include the plurality of conductive patterns 12, but not limited thereto. The material of the conductive layer M1 may include copper, aluminum, other highly conductive materials or a combination of the above, but is not limited thereto.

The dielectric layer DL6 is disposed on the dielectric layer DL5 and covers the conductive layer M1. For example, the material of the dielectric layer DL6 may include silicon nitride, silicon oxide, non-conductive inorganic material, non-conductive polymer film, glue, or the like, but not limited thereto. The dielectric layer DL6 may include a plurality of openings A4 (only one is shown) exposing the plurality of conductive patterns 12, respectively.

The plurality of pads P2 (only one is shown) are disposed on the dielectric layer DL6. The pad P2 may be electrically connected to the corresponding conductive pattern 12 through the corresponding opening A4. The pad P2 may be configured to reduce the probability of formation an intermetallic compound between the conductive material CM and the conductive pattern 12. For example, the pad P2 may include electroless nickel immersion gold, electroless nickel electroless palladium immersion gold, immersion silver, electrolytic gold, or electrolytic nickel, but not limited thereto.

A via hole TH may be formed by, for example, a laser drilling process. Taking FIG. 1 as an example, the via hole TH may penetrate through the pad P1, the dielectric layer DL3, the dielectric layer DL2, the dielectric layer DL1, the first substrate SUB1, and the adhesive layer GL to expose the pad P2.

The conductive material CM is formed in the via hole TH. Taking FIG. 1 as an example, the conductive material CM may contact the pad P2 and cover the corresponding pad P1, but not limited thereto. For example, the conductive material CM may include tin, copper paste or other metal materials, and the method of forming the conductive material CM in the via hole TH may include printing, but not limited thereto.

The plurality of conductive bumps BP are respectively disposed on the plurality of pads P1. The material of the conductive bump BP may include tin, copper paste, other metal materials, or anisotropic conductive film (ACF), but is not limited thereto.

The electronic component EC is disposed on the substrate structure 10 and is electrically coupled to the conductive patterns 12. For example, the electronic component EC may be bonded to the plurality of pads P1 through the plurality of conductive bumps BP. In this way, the electronic component EC may be electrically connected to the driving component 11 through the conductive bump BP, the pad P1, and the conductive pattern CP, and the electronic component EC may be electrically connected to the conductive pattern 12 through the conductive bump BP, the pad P1, the conductive pattern CP, the circuit CK1 (or the circuit CK2), the conductive material CM, and the pad P2 (i.e. the electronic component EC is directly electrically connected to the conductive pattern 12). On the other hand, the driving component 11 may be electrically connected to the conductive pattern 12 through the conductive pattern CP, the pad P1, the conductive bump BP, the electronic component EC, the circuit CK1 (or the circuit CK2), the conductive material CM, and the pad P2.

FIG. 1 schematically shows that the electronic component EC is a light emitting diode chip, but the type of the electronic component EC is not limited thereto. According to different applications, the electronic component EC may also be a capacitor, an inductor, a variable capacitor, a filter, a resistor, a diode, a microelectromechanical system (MEMS) or a liquid crystal chip, but not limited thereto. For example, when the electronic device 1 serves as a backlight device or a display device, the electronic component EC may be a light emitting diode chip. When the electronic device 1 serves as an antenna device, the conductive layer M1 may shield electromagnetic waves, and the electromagnetic waves may be transmitted upward to the electronic component EC through a gap G between the plurality of conductive patterns 12, and the light emitting diode chip may be replaced with a capacitor, an inductor, a variable capacitor or a diode, or the like. By changing the voltage applied to the variable capacitor, the phase and amplitude of the electromagnetic waves may be changed accordingly, thereby controlling the direction of the electromagnetic waves or improving the directivity of the antenna device.

The underfill UF is disposed between the electronic component EC and the passivation layer PL1. The underfill UF may be configured to strengthen the fixation of the electronic components EC, improve reliability, absorb external light, reduce reflection, or protect the underlying driving component 11 or circuit. For example, the material of the underfill UF may include silica gel or epoxy resin, but not limited thereto.

The protective layer PT is formed on the electronic component EC. For example, the protective layer PT may be disposed on the passivation layer PL1 and cover the underfill UF and the conductive material CM. The protective layer PT may be configured to protect the underlying component or improve reliability. For example, the material of the protective layer PT may include silica gel or epoxy resin, but not limited thereto.

In this embodiment, by forming the thick conductive pattern 12 having, for example, the thickness T12 greater than or equal to 0.5 μm and less than or equal to 15 μm (0.5 μm thickness T12≤15 μm), the conductive pattern 12 may serve not only to transmit signals or shield electromagnetic waves, but also to dissipate heat. For example, the conductive pattern 12 may dissipate the heat generated by the operation of the electronic component EC by means of thermal conduction. Moreover, the plurality of conductive patterns 12 (the patterned conductive layer M1) also help to increase the heat dissipation area or to uniformize the heat distribution. Further, forming the driving component 11 and the conductive pattern 12 requiring a high temperature process on the first substrate SUB1 and the second substrate SUB2, respectively, then combining the first substrate SUB1 and the second substrate SUB2 through the adhesive layer GL helps to improve the warpage problem caused by the high temperature process. Furthermore, separating the driving component 11 and the conductive pattern 12 by the first substrate SUB1 and the adhesive layer GL helps to reduce the resistive-capacitive loading between the driving component 11 and the conductive pattern 12.

It should be understood that according to different requirements, the electronic device 1 may include more or less film layers, such as more or less dielectric layers, more or less conductive layers. Alternatively, some of the above-mentioned film layers may be omitted in the electronic device 1. For example, the underfill UF may be omitted in the electronic device 1 so as to simplify the process, but the disclosure is not limited thereto. Alternatively, the protective layer PT may be omitted in the electronic device 1.

In some embodiments, a manufacturing method of the electronic device 1 may include sequentially forming the dielectric layer DL1, the conductive layer M2, the dielectric layer DL2, the semiconductor layer (not shown), the conductive layer M3, the dielectric layer DL3, the conductive layer M4, the dielectric layer DL4, the passivation layer PL1, and the plurality of pads P1 on the first substrate SUB1. Next, the first substrate SUB1 is cut (may be omitted) and the first substrate SUB1 is thinned (may be omitted). Then, the plurality of electronic components EC are bonded to the plurality of pads P1 through the plurality of conductive bumps BP, and then the underfill UF is formed. The dielectric layer DL5, the conductive layer M1, the dielectric layer DL6, and a plurality of pads P2 (only one is shown) are sequentially formed on the second substrate SUB2. Next, the second substrate SUB2 is cut (may be omitted) and the second substrate SUB2 is thinned (may be omitted). Then, the first substrate SUB1 and the second substrate SUB2 are combined through the adhesive layer GL. Next, the via hole TH is formed by a drilling process, and the conductive material CM is formed in the via hole TH. Then, the protective layer PT is formed. In other embodiments, the first substrate and the second substrate may be combined first and then cut together.

Figure 2:
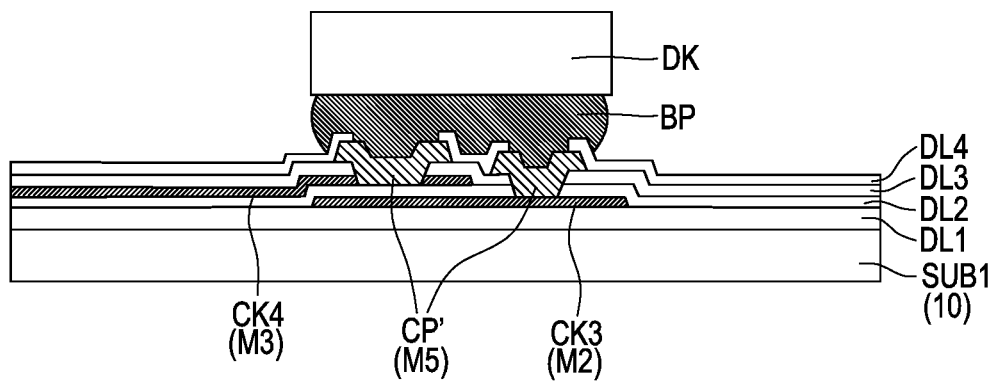
Figure 3:
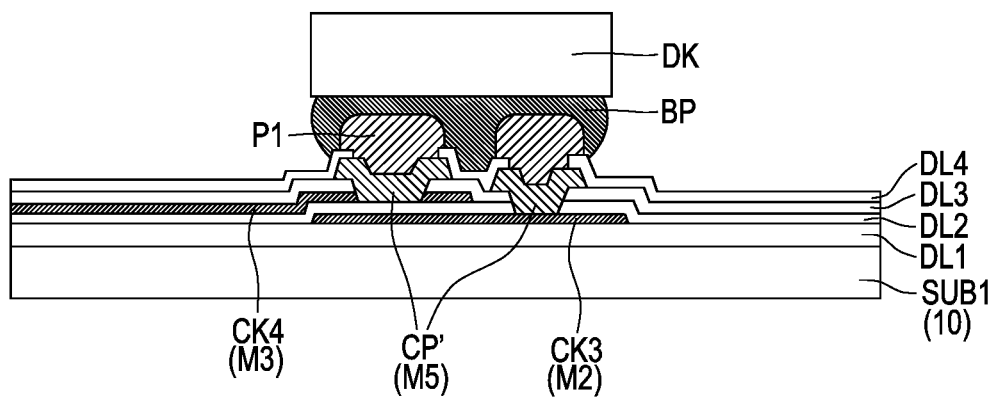

In some embodiments, as shown in FIGS. 2 and 3, the electronic device may further include a driving circuit DK. The driving circuit DK may be bonded to the substrate structure 10 after the protective layer PT is formed, but is not limited thereto.

In some embodiments, the driving circuit DK may be bonded to the substrate structure 10 (e.g. the first substrate SUB1) and may be electrically connected to the electronic component EC (shown in FIG. 1) through at least one of the conductive layers (e.g. the conductive layer M1, the conductive layer M2, the conductive layer M3, and the conductive layer M4) or other conductive layers (e.g. a conductive layer M5). The driving circuit DK may include an integrated circuit chip, a thin-film transistor chip, a flexible printed circuit (FPC), a printed circuit board (PCB), a COB (chip on board), or a COF (chip on film), but is not limited thereto. The thin-film transistor chip may be a thin-film transistor circuit formed on a substrate, and then cut to the chip size. The substrate may be glass, polymer film, porous film, or the like.

Taking FIG. 2 as an example, the driving circuit DK may be electrically connected to a plurality of conductive patterns CP' formed on the first substrate SUB1 through the conductive bump BP. For example, the plurality of conductive patterns CP' belong to the conductive layer M5, but not limited thereto. The material of the conductive layer M5 may include metal oxides such as indium tin oxide (ITO), but is not limited thereto. One conductive pattern CP' of the plurality of conductive patterns CP' may be electrically connected to the electronic component EC through, for example, a circuit CK4 in the conductive layer M3, and another conductive pattern CP' of the plurality of conductive patterns CP' may be electrically connected to other components through a circuit CK3 in the conductive layer M2.

FIG. 3 is similar to FIG. 2, except that the conductive bump BP in FIG. 3 is further electrically connected to the conductive pattern CP through the plurality of pads P1.

For the purpose of explanation, the remaining components and film layers of the electronic device are omitted in FIGS. 2 and 3. It should be understood that the method of bonding the driving circuit DK and the substrate structure 10 (e.g. the substrate to which the driving circuit DK is bonded or the components/layers bonded) or the level of layer of the connecting circuit between the driving circuit DK and the electronic component EC may be changed according to requirements, and is not limited to what is shown in FIG. 2 and FIG. 3. In addition, the electronic devices of the following embodiments may further include the driving circuit DK and/or other active or passive components. The driving circuit DK, other active or passive components may be connected to the substrate structure 10 through solder, anisotropic conductive film, metal bonding, ultrasonic bonding, copper paste (including nano-copper), silver paste (including nano-silver), or copper pillar, which will not be repeated below.

Figure 4:
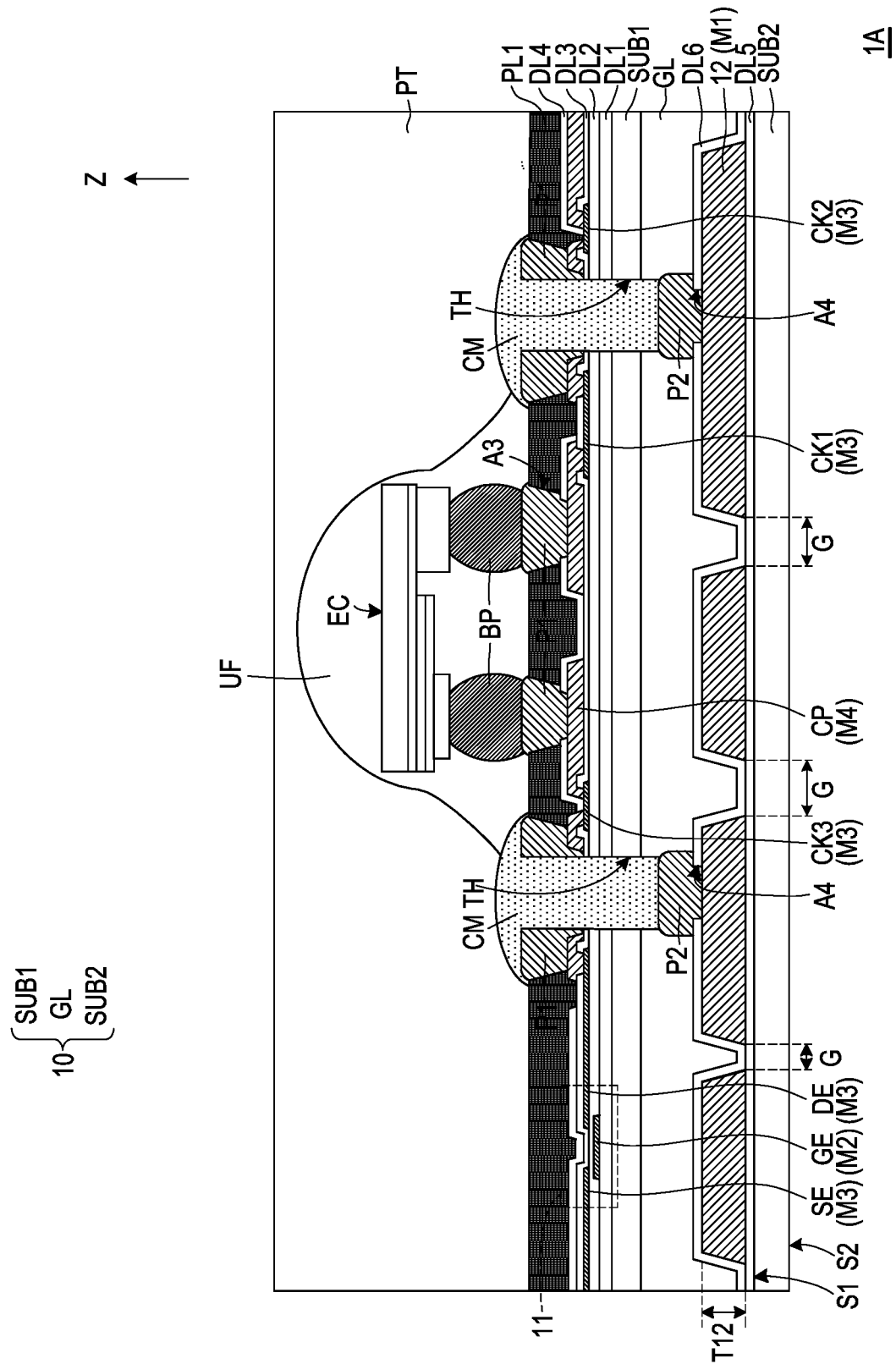

Referring to FIG. 4, the main differences between an electronic device 1A and the electronic device 1 of FIG. 1 are described as follows. In the electronic device 1A, the number of connections between the electronic component EC and the conductive layer M1 is increased to further improve the effect of heat dissipation. For example, the via hole TH may be formed between the electronic component EC and the driving component 11 electrically connected thereto, and a conductive material CM may be formed in the via hole TH. The conductive layer M3 may further include the circuit CK3, and the circuit CK3 is located between the conductive material CM and the electronic component EC. The electronic component EC is electrically connected to the driving component 11 through, for example, the conductive bump BP, the pad P1, the conductive pattern CP, the circuit CK3, the conductive material CM, the pad P2, and the conductive pattern 12.

Figure 5:
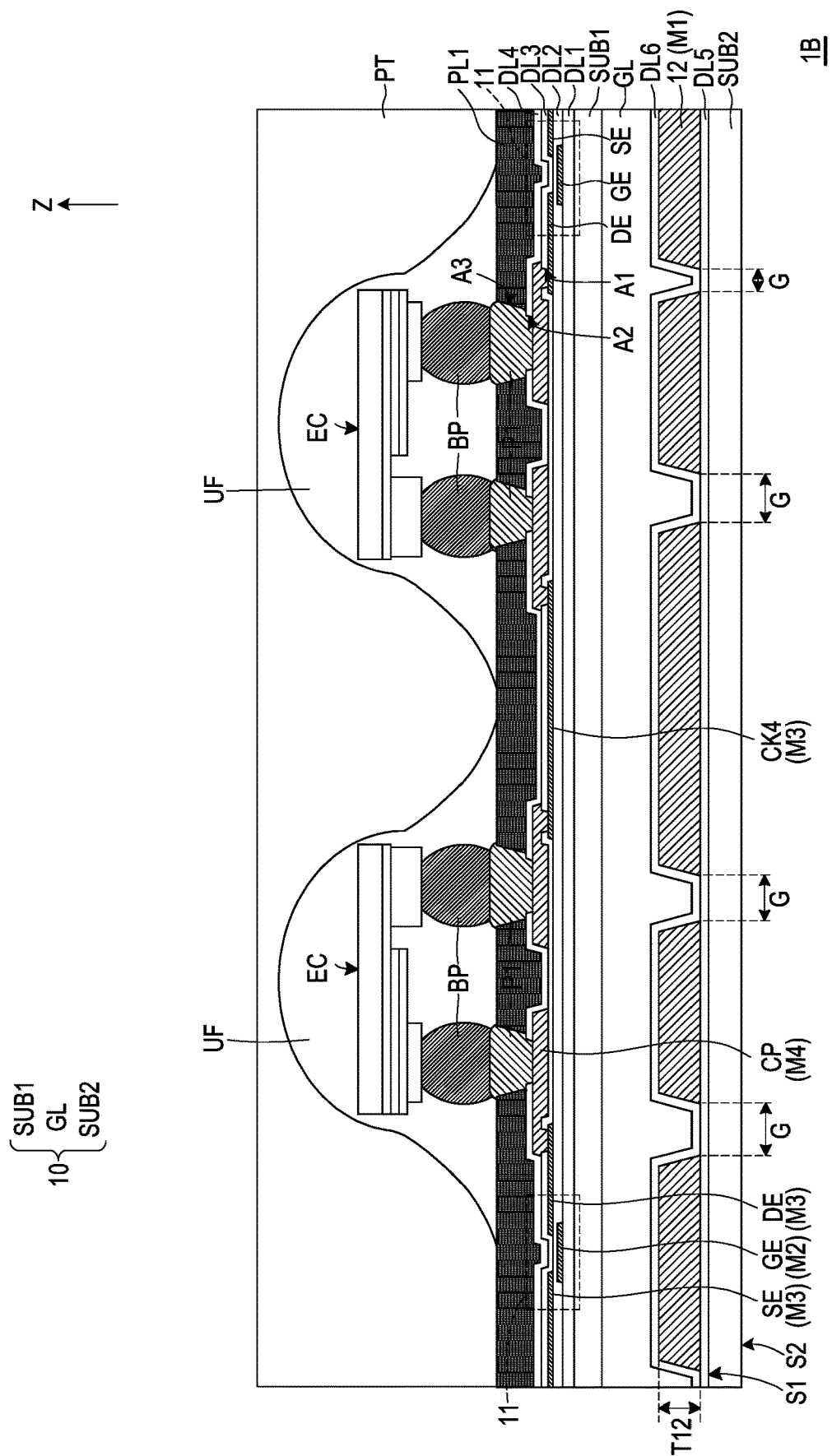

Referring to FIG. 5, the main differences between an electronic device 1B and the electronic device 1 of FIG. 1 are described as follows. In the electronic device 1B, the electronic component EC is coupled to the conductive pattern 12. That is, the electronic component EC and the conductive pattern 12 are not connected to each other by any conductors. As shown in FIG. 5, the electronic device 1B may omit the via hole TH and the conductive material CM, which helps to simplify the process, shorten the process time, reduce the process cost, or make an electronic device 1D thinner and lighter. The conductive layer M3 may further include the circuit CK4, and two adjacent electronic components EC may be electrically connected through the circuit CK4.

Figure 6:
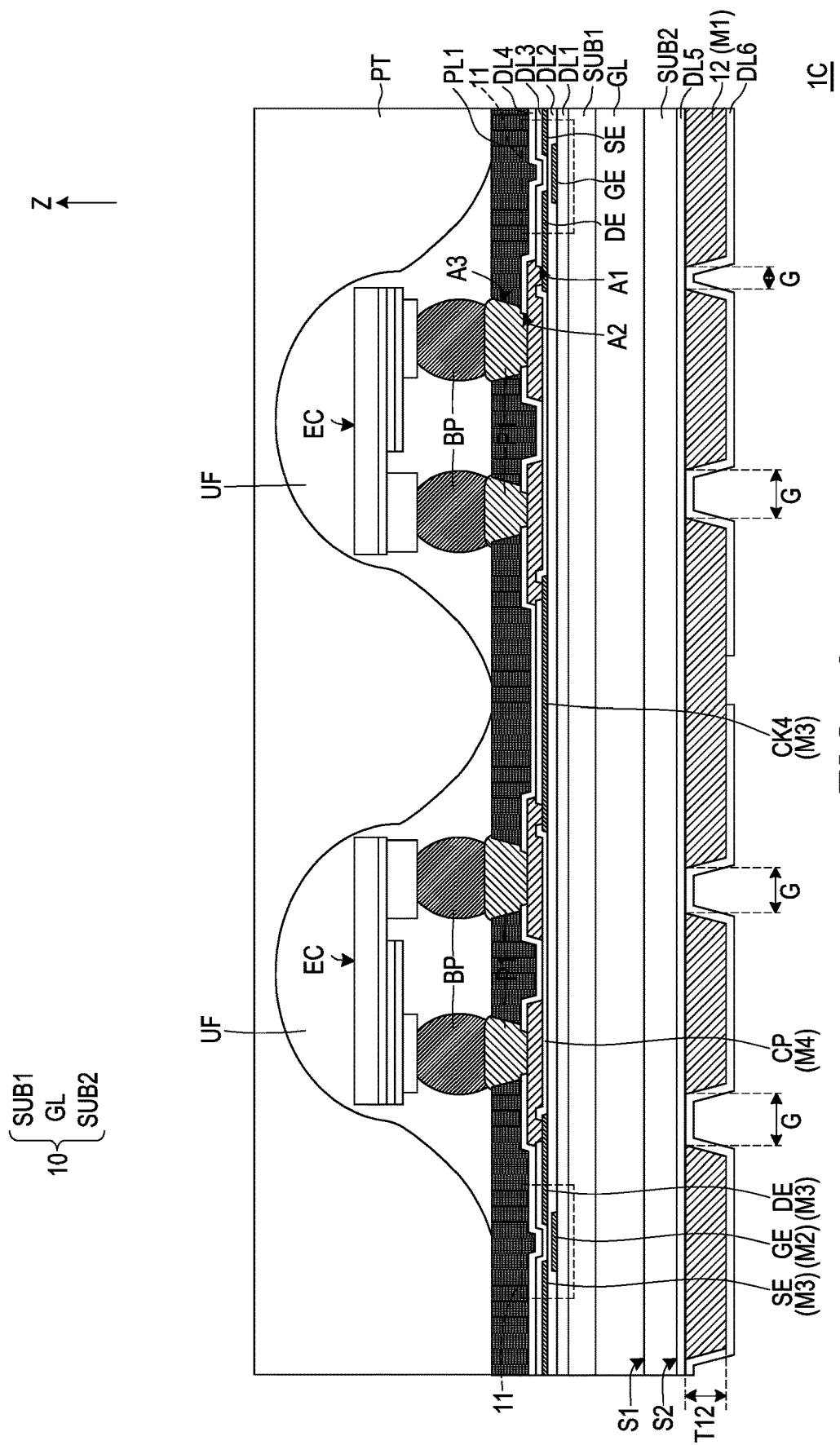

Referring to FIG. 6, the main difference between an electronic device 1C and the electronic device 1B of FIG. 5 is described as follows. In the electronic device 1C, the dielectric layer DL5, the conductive layer M1, and the dielectric layer DL6 are disposed on the second side S2 of the second substrate SUB2 to enhance heat dissipation or shield electromagnetic waves.

Figure 7:
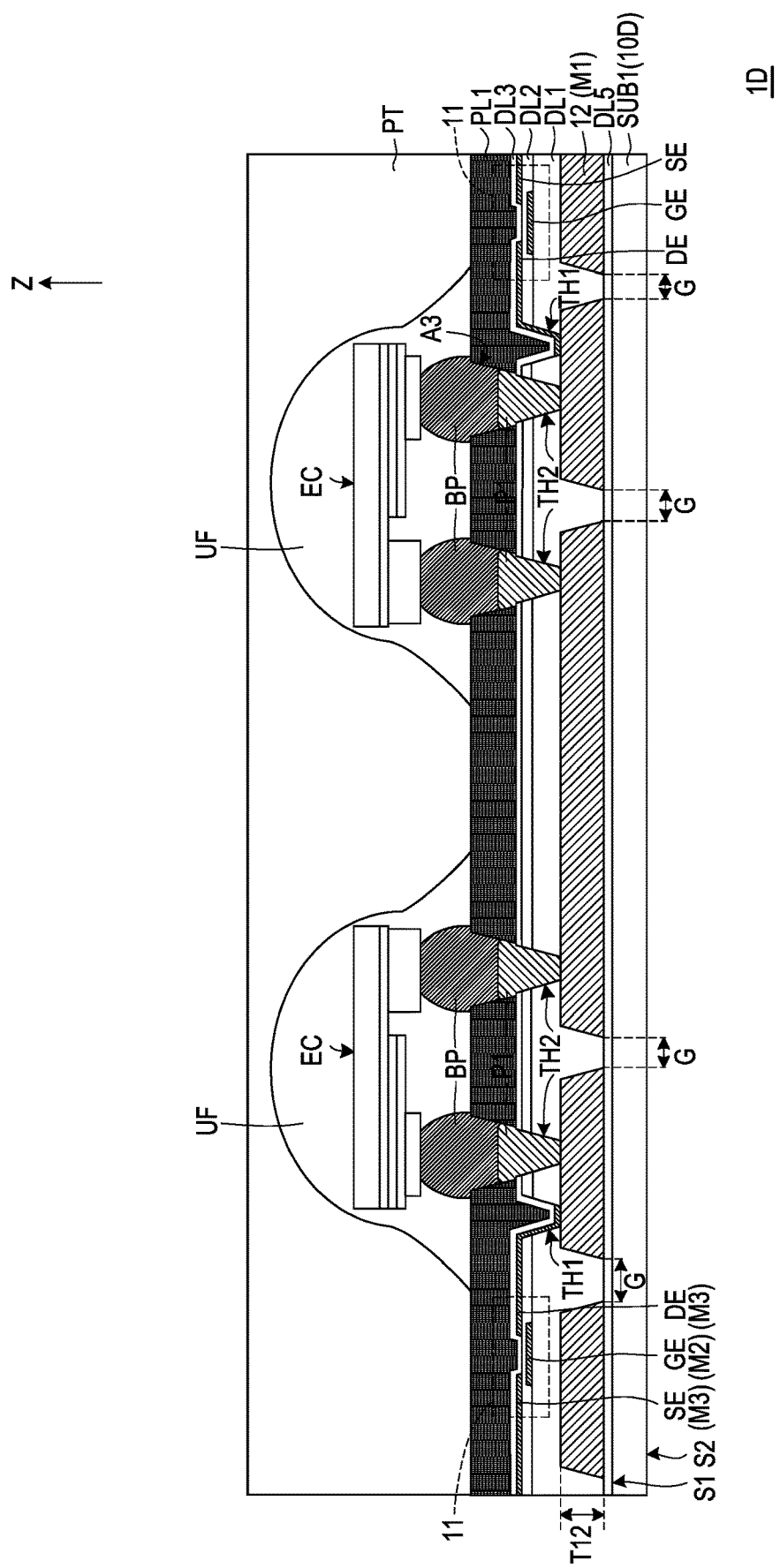

Referring to FIG. 7, the main differences between the electronic device 1D and the electronic device 1B of FIG. 5 are described as follows. In the electronic device 1D, a substrate structure 10D includes one substrate, namely the first substrate SUB1. The dielectric layer DL5 and the conductive layer M1 are sequentially disposed on the first substrate SUB1. The dielectric layer DL1 is disposed on the dielectric layer DL5 and covers the conductive layer M1. The conductive layer M2, the dielectric layer DL2, the semiconductor layer (not shown), the conductive layer M3, the dielectric layer DL3, and the passivation layer PL1 are sequentially disposed on the dielectric layer DL1. The electronic device 1D includes a plurality of via holes TH1 and a plurality of via holes TH2. The via hole TH1 penetrates through the dielectric layer DL1 and the dielectric layer DL2 and exposes the corresponding conductive pattern 12. The drain DE in the conductive layer M3 is further disposed in the via hole TH1 and is electrically connected to the corresponding conductive pattern 12 through the via hole TH1. The via hole TH2 penetrates through the dielectric layer DL1, the dielectric layer DL2, and the dielectric layer DL3, and at least partially overlaps with the corresponding opening A3 in the direction Z. The pad P1 is disposed in the opening A3 and the corresponding via hole TH2 and is electrically connected to the corresponding conductive pattern 12 through the opening A3 and the via hole TH2. The conductive bump BP is disposed in the opening A3 and electrically connected to the corresponding pad P1 through the opening A3.

The electronic component EC may be electrically connected to the driving component 11 through the conductive bump BP, the pad P1, and the conductive pattern 12, and the electronic component EC may be electrically connected to an adjacent electronic component EC through the conductive bump BP, the pad P1, and the conductive pattern 12.

In this embodiment, by reducing the number of required layers (such as the number of substrates, conductive layers, dielectric layers, or the like), it helps to simplify the process, shorten the process time, reduce the process cost, or make the electronic device 1D thinner and lighter.

In some embodiments, the method of manufacturing the electronic device 1D may include sequentially forming the dielectric layer DL5, the conductive layer M1, the dielectric layer DL1, the conductive layer M2, the dielectric layer DL2, a semiconductor layer (not shown), the conductive layer M3, the dielectric layer DL3, the passivation layer PL1, and a plurality of pads P1 on the first substrate SUB1. Next, the first substrate SUB1 is cut (may be omitted) and the first substrate SUB1 is thinned (may be omitted). Then, the plurality of electronic components EC are bonded to the plurality of pads P1 through the plurality of conductive bumps BP, and then the underfill UF is formed. Then, the protective layer PT is formed. In some embodiments, the electronic device 1D may also include the driving circuit DK as shown in FIG. 2 and FIG. 3, and the driving circuit DK may be bonded to the substrate structure 10D after the protective layer PT is formed, but not limited thereto.

Figure 8:
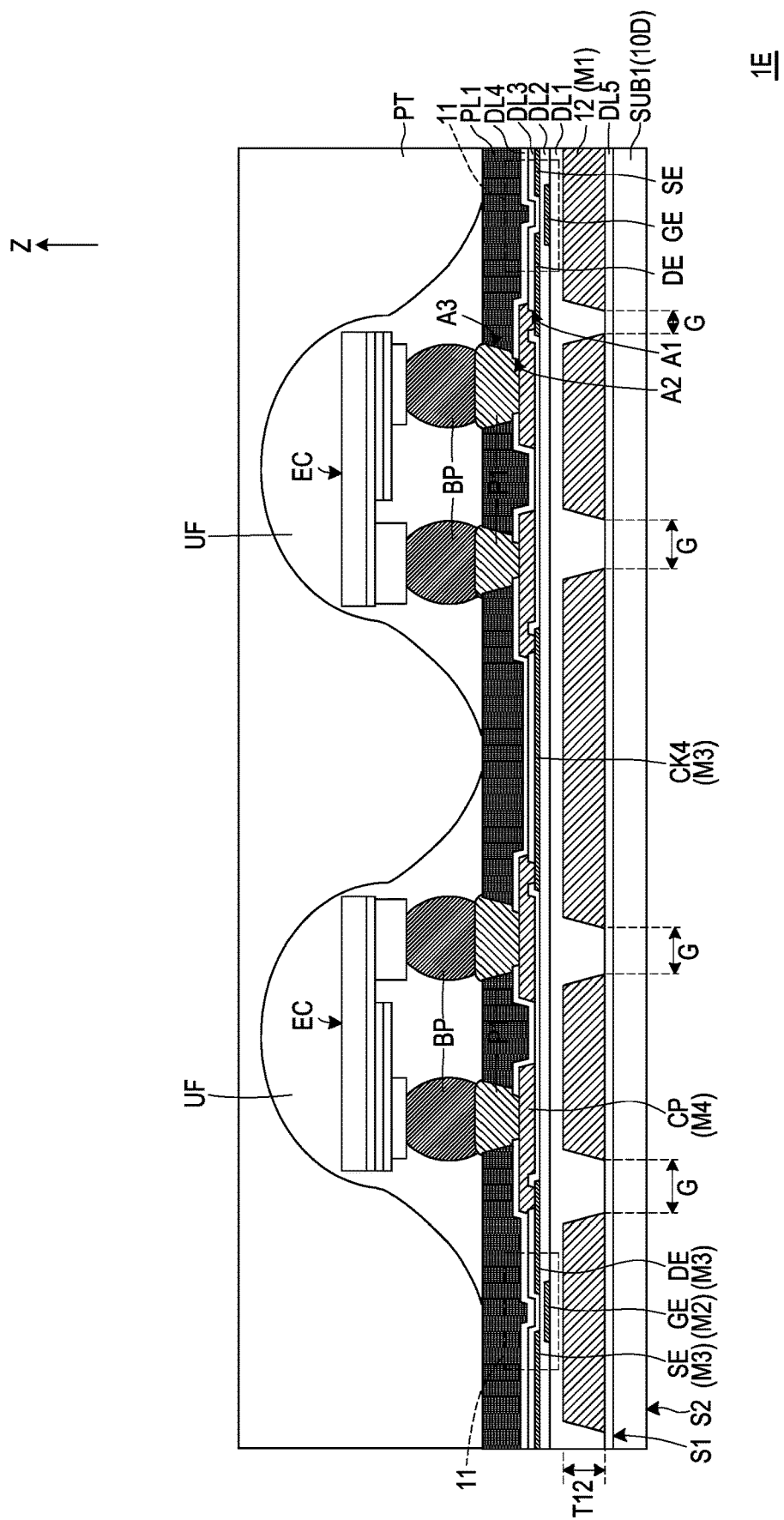

Referring to FIG. 8, the main differences between an electronic device 1E and the electronic device 1B of FIG. 5 are described as follows. In the electronic device 1E, the substrate structure 10D includes one substrate, namely the first substrate SUB1. The dielectric layer DL5 and the conductive layer M1 are sequentially disposed on the first substrate SUB1. The dielectric layer DL1 is disposed on the dielectric layer DL5 and covers the conductive layer M1. Related description of the film layer on the dielectric layer DL1 may be referred to in the description of FIG. 5, which will not be repeated here.

In this embodiment, by reducing the number of required layers (such as the number of substrates, conductive layers or dielectric layers, or the like), it helps to simplify the process, shorten the process time, reduce the process cost, or make the electronic device 1E thinner and lighter. In addition, under the structure provided with the dielectric layer DL4 and the conductive layer M4, the distance between the conductive layer M1 and the conductive layer M2, the distance between the conductive layer M1 and the conductive layer M3, or the distance between the conductive layer M1 and the conductive layer M4 may be increased as required to reduce the resistive-capacitive loading.

Figure 9:
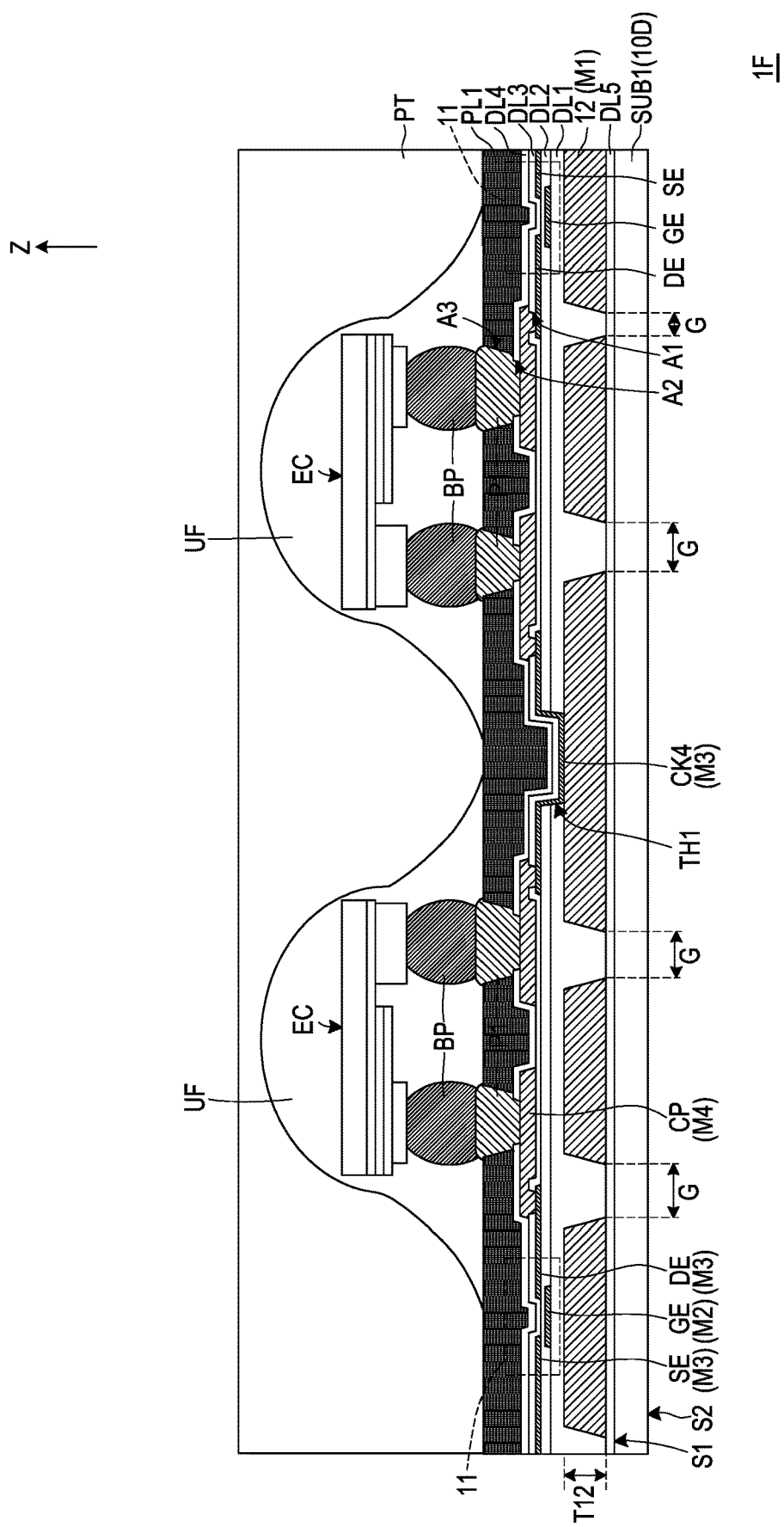

Referring to FIG. 9, the main difference between an electronic device 1F and the electronic device 1E of FIG. 8 is described as follows. In the electronic device 1F, the circuit CK4 in the conductive layer M3 is connected to the conductive pattern 12 through the via hole TH1 penetrating the dielectric layer DL1 and the dielectric layer DL2 so as to further enhance the effect of heat dissipation.

Figure 10:
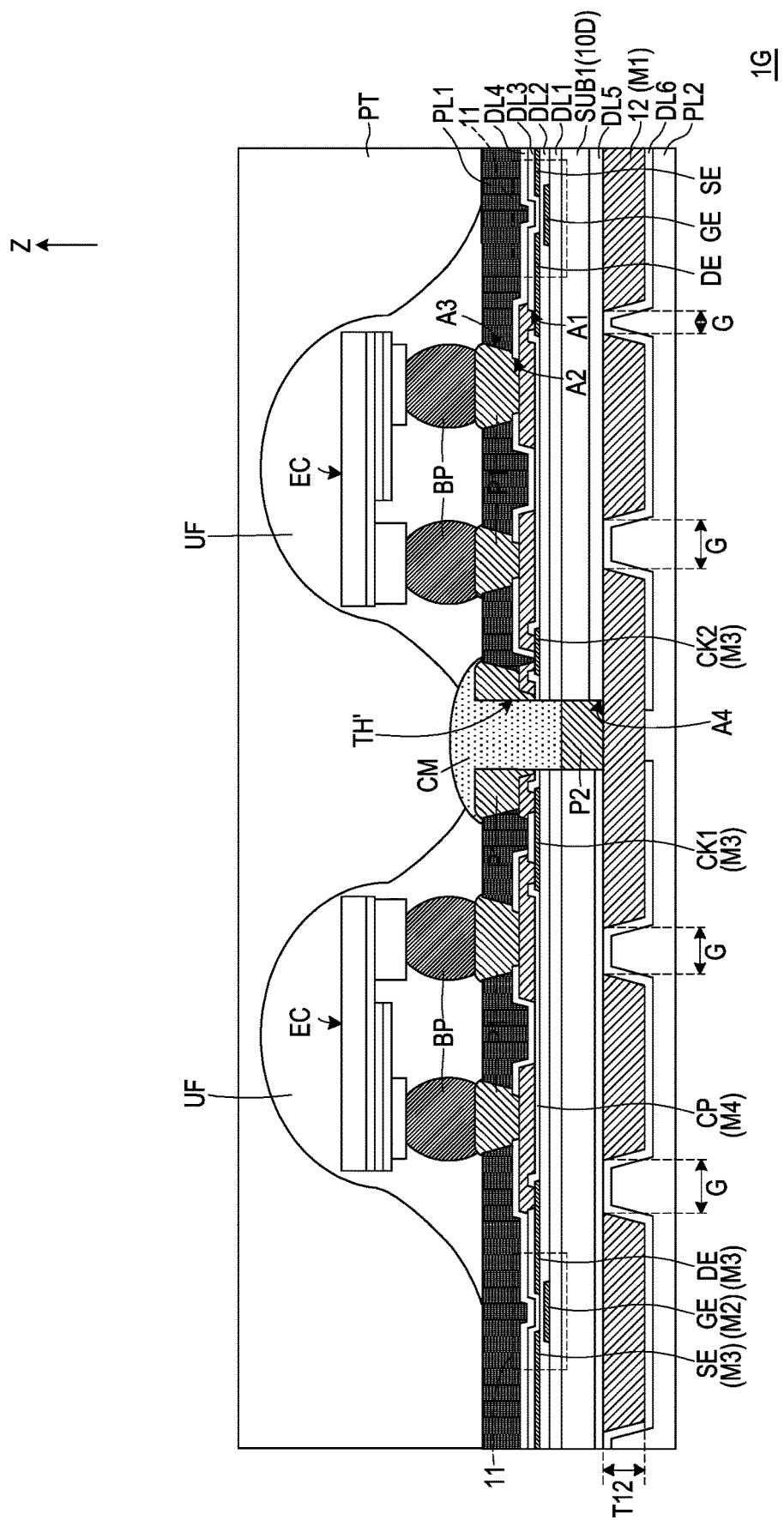

Referring to FIG. 10, the main differences between an electronic device 1G and the electronic device 1 of FIG. 1 are described as follows. In the electronic device 1G, the substrate structure 10D includes one substrate, namely first substrate SUB1. The dielectric layer DL5, the conductive layer M1, and the dielectric layer DL6 are sequentially disposed on the surface of the first substrate SUB1 away from the driving component 11. Moreover, the electronic device 1G further includes a passivation layer PL2. The passivation layer PL2 is disposed on the dielectric layer DL6. The passivation layer PL2 may be configured to protect the dielectric layer DL6. For example, the material of the passivation layer PL1 may include silica gel or epoxy resin, but not limited thereto. The pad P2 is disposed in a via hole TH' penetrating the pad P1, the dielectric layer DL3, the dielectric layer DL2, the dielectric layer DL1, and the first substrate SUB1 and in the opening A4 of the dielectric layer DL5, and is electrically connected to the corresponding conductive pattern 12. The conductive material CM is formed in the via hole TH'.

In this embodiment, by reducing the required layers (e.g. the second substrate SUB2 and the adhesive layer GL), it helps to reduce the process cost or make the electronic device 1D thinner and lighter. Moreover, by disposing the conductive layer M1 on the surface of the first substrate SUB1 away from the driving component 11, it helps to reduce the resistive-capacitive loading.

Figure 11:
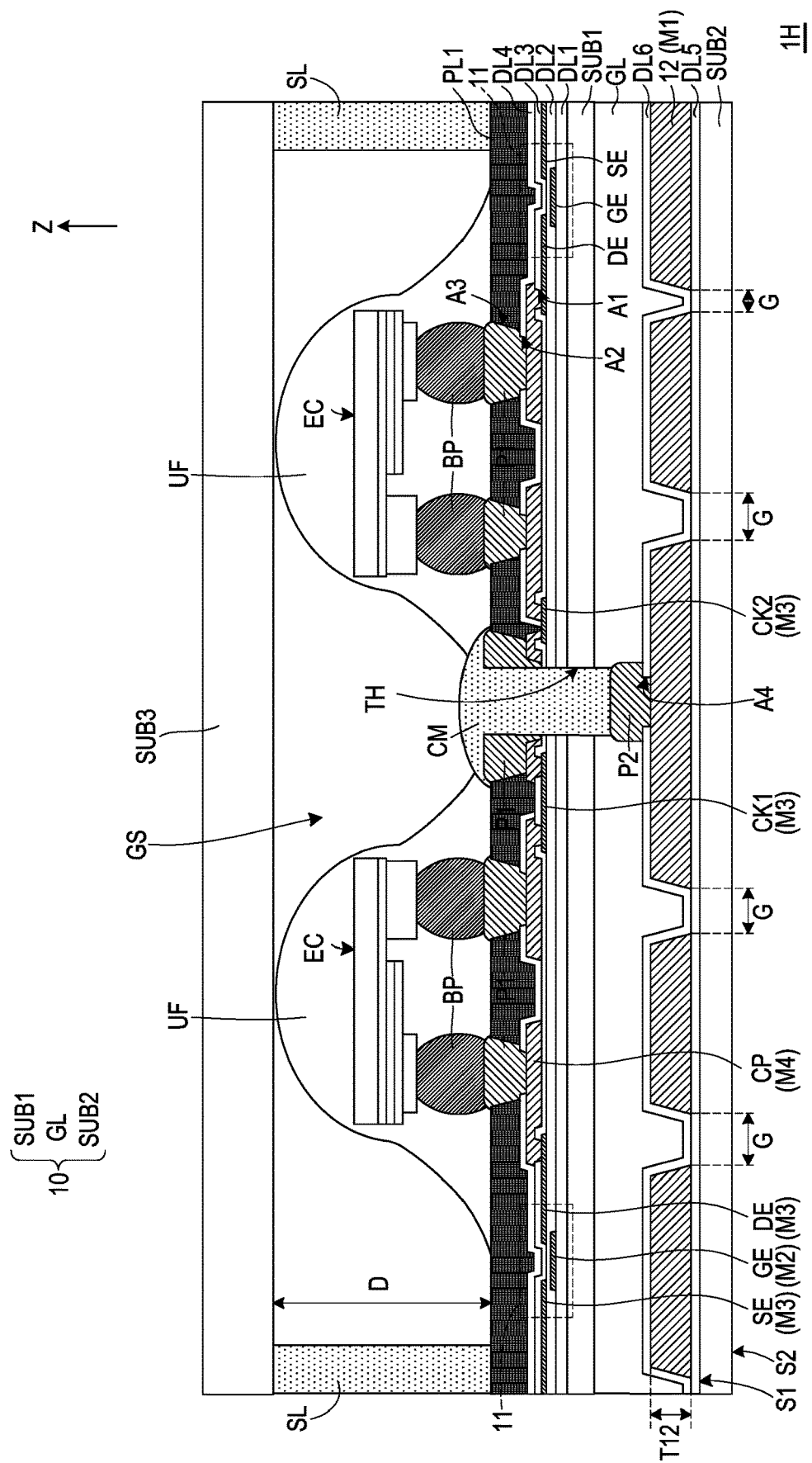

Referring to FIG. 11, the main differences between an electronic device 1H and the electronic device 1 of FIG. 1 are described as follows. The electronic device 1H further includes a third substrate SUB3 and a sealing component SL, and the electronic device 1H may not need to include the protective layer PT. The third substrate SUB3 may include a polymer film, a porous film, glass, a printed circuit board, or a base layer including ceramics, but not limited thereto. The third substrate SUB3 covers the plurality of electronic components EC, and the third substrate SUB3 may be fixed on the substrate structure 10 through the sealing component SL. For example, the third substrate SUB3 may be fixed on the passivation layer PL1 through the sealing component SL, and a distance D between the third substrate SUB3 and the passivation layer PL1 in the direction Z may be controlled through the underfill UF. The underfill UF may be selected from a soft material, such as silicone, spacer, glue or polymer, but not limited thereto. The spacer may include a photo spacer, a ball spacer, or an adhesive ball spacer, but not limited thereto.

In some embodiments, a gap space GS between the third substrate SUB3 and the passivation layer PL1 may be filled with air, inert gas, glue, stable liquid, or polymer, but not limited thereto. Alternatively, the gap space GS between the three substrate SUB3 and the passivation layer PL1 may be vacuum.

In summary, in the embodiments of the disclosure, the conductive pattern may be formed to dissipate heat, increase the heat dissipation area, or uniformize the heat distribution. In some embodiments, the driving component and the conductive pattern may be formed on different substrates respectively, and then the two substrates may be combined through an adhesive layer, which helps to improve the warpage problem caused by the high temperature process. In addition, by spacing the driving component and the conductive pattern apart, it helps to reduce the resistive-capacitive loading between the driving component and the conductive pattern.

The above embodiments are only used to illustrate the technical solutions of the disclosure, but not to limit them; although the disclosure has been described in detail with reference to the foregoing embodiments, those skilled in the art should understand that the technical solutions described in the foregoing embodiments can still be modified, or some or all of the technical features thereof can be equivalently replaced, and these modifications or substitutions do not make the essence of the corresponding technical solutions deviate from the scope of the technical solutions of the embodiments of the disclosure.

Although the embodiments of the disclosure and their advantages have been disclosed as above, it should be understood that any person having ordinary knowledge in the technical field can make changes, substitutions and modifications without departing from the spirit and scope of the disclosure, and the features of each embodiment can be arbitrarily mixed and replaced with each other to form other new embodiments. In addition, the protection scope of the disclosure is not limited to the process, machine, manufacture, material composition, device, method and steps in the specific embodiments described in the specification; anyone with ordinary knowledge in the art can understand the present or future developed processes, machines, manufactures, compositions, devices, methods and steps from the disclosure, and anything that can perform substantially the same functions or achieve substantially the same results in the embodiments described herein can be used in accordance with the disclosure. Therefore, the protection scope of the disclosure includes the above-mentioned processes, machines, manufactures, material compositions, devices, methods and steps. In addition, each claim constitutes a separate embodiment, and the scope of the disclosure also includes combinations of each claim and the embodiment. The scope of protection of the disclosure shall be defined by the appended claims.

What is claimed is:

1. An electronic device, comprising:
a substrate structure;
a conductive pattern, formed on the substrate structure;
a driving component, disposed on the substrate structure and electrically coupled to the conductive pattern; and
an electronic component, disposed on the substrate structure and electrically coupled to the conductive pattern,
wherein a thickness of the conductive pattern is greater than or equal to 0.5 µm and less than or equal to 15 µm, and
wherein along a thickness direction of the electronic device, the electronic component and the conductive pattern are located on opposite sides of the driving component, respectively.

2. The electronic device according to claim 1, wherein the substrate structure comprises a first substrate and a second substrate, the driving component is disposed on the first substrate and the conductive pattern is disposed on the second substrate, and the first substrate and the second substrate are combined.

3. The electronic device according to claim 2, wherein the second substrate comprises a first side facing the first substrate and a second side opposite to the first side, and the conductive pattern is disposed on the first side.

4. The electronic device according to claim 2, wherein the second substrate comprises a first side facing the first substrate and a second side opposite to the first side, and the conductive pattern is disposed on the second side.

5. The electronic device according to claim 2, wherein at least one of the first substrate and the second substrate comprises a via hole and a conductive material formed therein, and the driving component is electrically connected to the conductive pattern through the conductive material.

6. The electronic device according to claim 5, wherein the conductive material comprises tin or copper paste.

7. The electronic device according to claim 5, wherein the electronic component is located between the driving component and the via hole, and the driving component is electrically connected to the conductive pattern sequentially through the electronic component and the conductive material formed in the via hole.

8. The electronic device according to claim 5, wherein the electronic device comprises a plurality of the electronic components, and the via hole is disposed between two adjacent electronic components.

9. The electronic device according to claim 8, wherein the two adjacent electronic components are electrically connected to the conductive pattern through the conductive material formed in the via hole.

10. The electronic device according to claim 5, wherein the at least one of the first substrate and the second substrate comprises a plurality of the via holes and the conductive material formed therein, wherein one of the via holes is disposed between the driving component and the electronic component, and the electronic component is electrically connected to the driving component through the conductive material formed in the one of the via holes.

11. The electronic device according to claim 10, wherein the electronic component is located between two adjacent via holes, the electronic device comprises a plurality of the conductive patterns, and the electronic component is electrically connected to different conductive patterns through the conductive material respectively located in the two adjacent via holes.

12. The electronic device according to claim 1, wherein the driving component comprises a transistor.

13. The electronic device according to claim 1, wherein the electronic component is directly electrically connected to the conductive pattern.

14. The electronic device according to claim 1, wherein the electronic component is coupled to the conductive pattern.

15. The electronic device according to claim 1, further comprising:
a protective layer, formed on the electronic component.

16. The electronic device according to claim 1, further comprising:
a third substrate, covering the electronic component; and
a sealing component, through which the third substrate is fixed on the substrate structure.

17. The electronic device according to claim 11, wherein the electronic component comprises a light emitting diode chip, a capacitor, an inductor, a variable capacitor, a filter, a resistor, a diode, an electromechanical system, or a liquid crystal chip.

18. The electronic device according to claim 11, wherein the substrate structure comprises the first substrate, and the conductive pattern, the driving component, and the electronic component are sequentially disposed on the first substrate.

19. The electronic device according to claim 18, wherein the electronic device comprises the plurality of the conductive patterns, the electronic component is electrically connected to two adjacent conductive patterns, and the electronic component is electrically connected to the driving component through one of the two adjacent conductive patterns.

* * * * *